United States Patent
Lin et al.

(10) Patent No.: US 6,621,167 B1
(45) Date of Patent: Sep. 16, 2003

(54) METAL INTERCONNECT STRUCTURE

(75) Inventors: Chien-Chung Lin, Taipei (TW);
Cheng-Yu Hung, Taipei (TW);
Chien-Mei Wang, Hsin-Chu (TW);
Chih-Hung Chen, Taipei (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/064,671

(22) Filed: Sep. 23, 2002

(51) Int. Cl.[7] .......................... H01L 29/40; H01L 23/52
(52) U.S. Cl. .................. 257/750; 257/762; 257/761; 257/758
(58) Field of Search ................ 257/750, 758, 257/761; 438/622–624, 639

(56) References Cited

U.S. PATENT DOCUMENTS

| | | | | |
|---|---|---|---|---|
| 6,037,668 A | * | 3/2000 | Cave et al. ............... | 257/784 |
| 6,468,894 B1 | * | 10/2002 | Yang et al. ............... | 438/622 |
| 6,486,558 B2 | * | 11/2002 | Sugiyama et al. ......... | 257/758 |
| 6,495,918 B1 | * | 12/2002 | Brintzinger ............... | 257/758 |
| 2001/0036737 A1 | * | 11/2001 | Iguchi et al. ............. | 438/692 |
| 2002/0011672 A1 | * | 1/2002 | Oku et al. ................ | 257/758 |

* cited by examiner

*Primary Examiner*—Jasmine J B Clark
(74) *Attorney, Agent, or Firm*—Winston Hsu (57) ABSTRACT

A metal interconnect structure generally includes a lower-layer metal wiring, an upper-layer metal wiring partially overlapping with the lower-layer metal wiring to define a via region thereof, a dielectric layer disposed between the lower-layer metal wiring and the upper-layer metal wiring, a plurality of via plugs arranged in the dielectric layer within a first area of the via region for electrically connecting the lower-layer metal wiring and the upper-layer metal wiring, and a plurality of first dielectric structures embedded in the upper-layer metal wiring within a second area of the via region, in which the first area does not overlap with the second area.

18 Claims, 7 Drawing Sheets

METAL INTERCONNECT STRUCTURE

BACKGROUND OF THE INVENTION

1. Field of the Invention

The present invention generally relates to damascene Cu-based interconnects in integrated circuits. More particularly, the present invention relates to a Cu-based interconnect structure capable of reducing dishing effects that might occur within a surface of a via region of a copper wiring having a large line width.

2. Description of the Prior Art

In the manufacturing of integrated circuits, interconnects within a level are made by damascene features called trenches that are filled with an electrically conductive material like metal. Interconnects between levels are made by damascene features called vias. These interconnects are made by first etching a line, in the case of trenches, or a hole, in the case of vias in a substrate. An electrical conductor is then deposited over the entire substrate. The excess conductor is removed by planarizing the substrate with, for example, a chemical-mechanical polishing (CMP) process.

Ideally, the CMP process produces interconnect lines with a top surface that is co-planar with top surface of the substrate. Unfortunately, widely spaced interconnect lines such as power bus lines that are designed to carry high current densities tend to display reduced copper fill after electroplating and subsequent CMP planarization. Furthermore, in the case of an interconnect region having a dense line layout, post-CMP metal residues, which are also known as "bridging", are frequently observed between two adjacent interconnect lines, which can lead to undesirable leakage current. One approach to solving the above-mentioned problems is to add a number of dielectric features into the wide interconnect lines. The dielectric features are also referred to as "oxide slots" by those skilled in the art.

Figure 1:
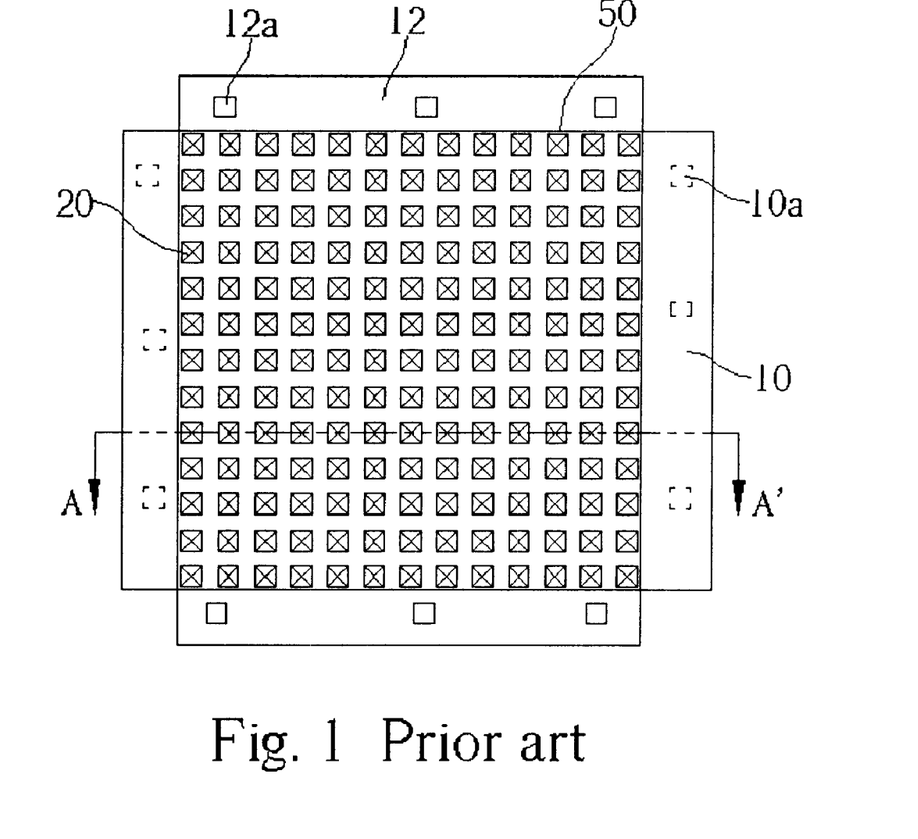
FIG. 1 is a schematic diagram partially illustrating an enlarged top view of a Cu-based interconnect structure according to the prior art.
Figure 2:
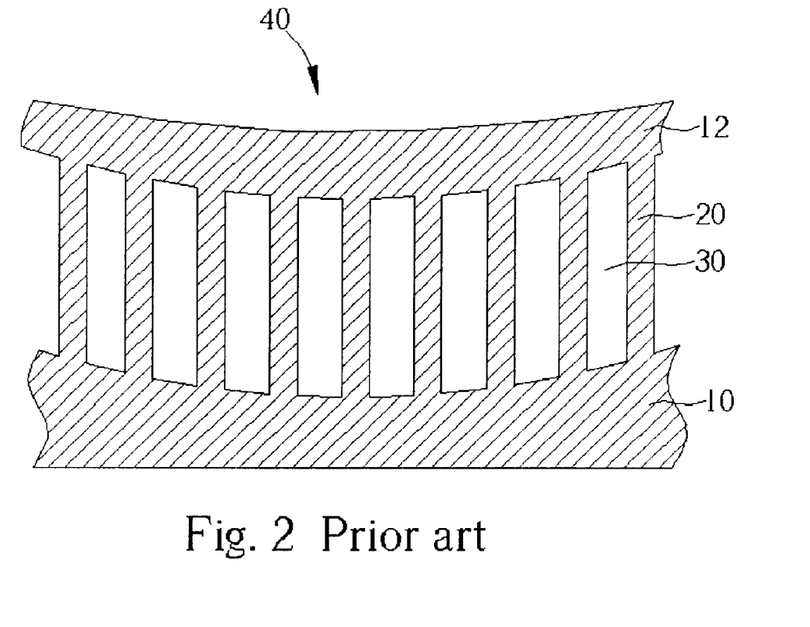
FIG. 2 is a schematic, cross-sectional view along line A—A of FIG.1.

Please refer to FIG. 1 and FIG. 2, where FIG. 1 is a schematic diagram partially illustrating an enlarged top view of a Cu-based interconnect structure according to the prior art and FIG. 2 is a schematic, cross-sectional view along line A-A" of FIG. 1. As shown in FIG. 1 and FIG. 2, an integrated circuit comprises a lower-layer metal wiring 10 intersecting an upper-layer metal wiring 12. Between the lower-layer metal wiring 10 and the upper-layer metal wiring 12, a layer of dielectric 30 is provided. Typically, assuming that the lower-layer metal wiring 10 and the upper-layer metal wiring 12 are power bus lines, both the lower-layer metal wiring 10 and the upper-layer metal wiring 12 have a line width of about 5 microns ($\mu$m). In this case, a 5 $\mu$m×5 $\mu$m overlapping region 50 (hereinafter referred to as a via region) is defined by the two layers of interconnect lines 10 and 12 for accommodating via plugs 20. As mentioned, to reduce CMP dishing effects, a plurality of oxide slots 10a and 12a are distributed in the lower-layer metal wiring 10 and the upper-layer metal wiring 12 respectively outside the via region 50.

According to the prior art, the via plugs 20 within the via region 50 usually reach a maximum number based on a predetermined design rule in order not to "open" the two layers of interconnect lines 10 and 12. Hence, oxide slots are forbidden from being introduced into the via region 50 during the layout of the interconnect patterns. A maximum number of via plugs 20 in this via region 50 assures steady operations during the pass of a high density current between the two layers of interconnect lines 10 and 12. However, the prior art interconnect structure, in which introduction of oxide slots is not allowed results in a dishing phenomenon. This dishing phenomenon results in a concave shaped surface of the interconnect, as indicated by the numeral 40.

Figure 3:
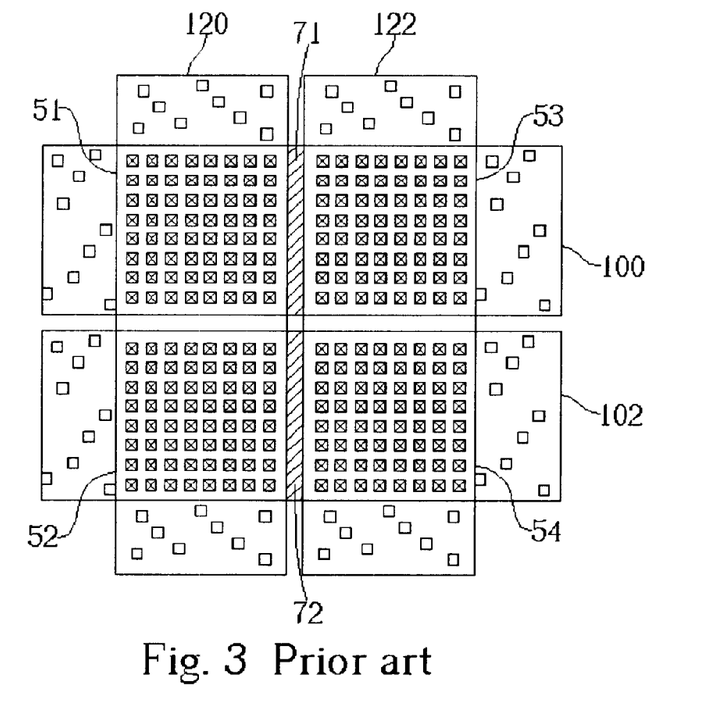
FIG. 3 is a schematic diagram partially illustrating an enlarged top view of a Cu-based dense line structure according to the prior art.

Please refer to FIG. 3. FIG. 3 is a schematic diagram partially illustrating an enlarged top view of a Cu-based dense line structure according to the prior art. As shown in FIG. 3, two upper-layer copper lines 120 and 122 and two lower-layer copper lines 100 and 102 are provided. The upper-layer copper line 120 and the lower-layer copper line 100 define a via region 51. The upper-layer copper line 120 and the lower-layer copper line 102 define a via region 52. The upper-layer copper line 122 and the lower-layer copper line 100 define a via region 53. The upper-layer copper line 122 and the lower-layer copper line 102 define a via region 54. The upper-layer copper line 120 is spaced apart from the upper-layer copper line 122 with a distance of about 0.26 microns, for example. Since there is no oxide slot formed within the via regions 51, 52, 53, and 54, post-CMP metal residues are left in the regions 71 and 72 between the two adjacent copper lines 120 and 122.

Consequently, there is a strong need to provide an improved interconnect structure that is capable of reducing dishing effects and bridging when manufacturing integrated circuits.

SUMMARY OF INVENTION

It is therefore a primary objective of the claimed invention to provide an improved metal interconnect structure to solve the above-mentioned problems.

According to the claimed invention, a metal interconnect structure is provided. The metal interconnect structure generally includes a lower-layer copper wiring, an upper-layer copper wiring partially overlapping with the lower-layer copper wiring to define a via region thereof, a dielectric layer disposed between the lower-layer copper wiring and the upper-layer copper wiring, a plurality of via plugs arranged in the dielectric layer within a first area of the via region for electrically connecting the lower-layer copper wiring and the upper-layer copper wiring, and a plurality of first dielectric structures embedded in the upper-layer copper wiring within a second area of the via region, in which the first area does not overlap with the second area.

According one preferred embodiment of this invention, the metal interconnect structure further comprises a plurality of second dielectric structures embedded in the lower-layer metal wiring within the second area of the via region.

These and other objectives of the claimed invention will no doubt become obvious to those of ordinary skill in the art after reading the following detailed description of the preferred embodiment, which is illustrated in the various figures and drawings.

DETAILED DESCRIPTION

Figure 4:
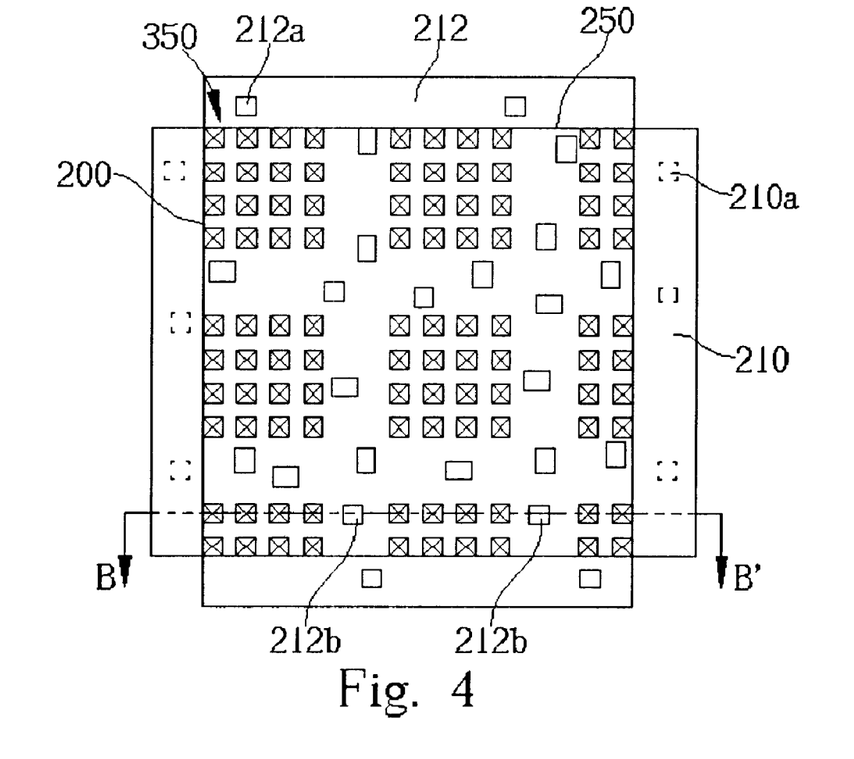
FIG. 4 is a schematic diagram partially illustrating an enlarged top view of a Cu-based interconnect structure according to the present invention.
Figure 5:
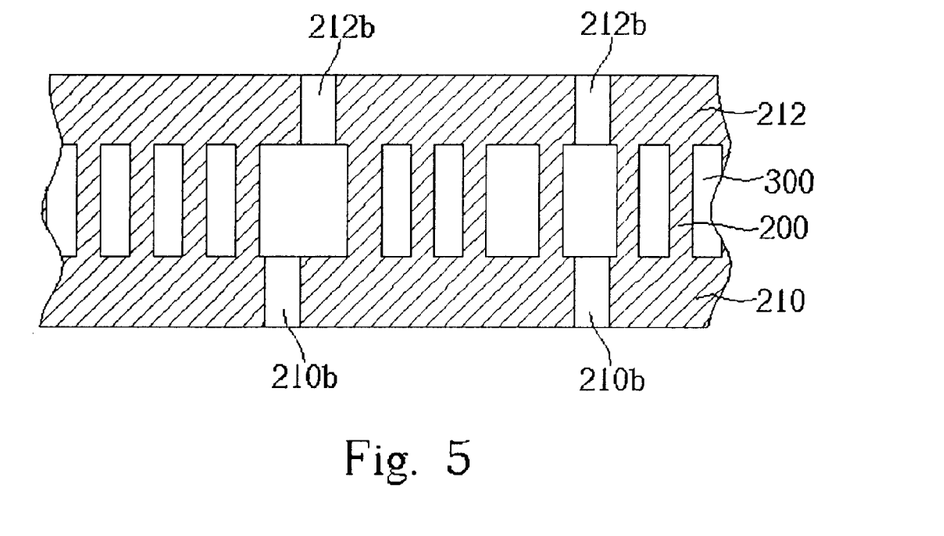
FIG. 5 is a schematic, cross-sectional view along line B—B of FIG.4.

Please refer to FIG. 4 and FIG. 5 where FIG. 4 is a schematic diagram partially illustrating an enlarged top view of a Cu-based interconnect structure according to the present invention and FIG. 5 is a schematic, cross-sectional view along line B—B of FIG. 4. As shown in FIG. 4 and FIG. 5, an integrated circuit comprises a lower-layer metal wiring 210 intersecting an upper-layer metal wiring 212. The lower-layer metal wiring 210 and the upper-layer metal wiring 212 are fabricated by using well-known dual damascene processes. Between the lower-layer metal wiring 210 and the upper-layer metal wiring 212 a layer of dielectric 300 is provided. Assuming that the lower-layer metal wiring 210 and the upper-layer metal wiring 212 are power bus lines, both the lower-layer metal wiring 210 and the upper-layer metal wiring 212 have a line width of about 5 microns ($\mu$m). A 5 $\mu$m×5 $\mu$m overlapping via region 250 is defined by the two layers of interconnect lines 210 and 212. It should be noted that the dimensions as described above are only exemplary and should not be used to limit the scope of the present invention.

Still referring to FIG. 4 with reference to FIG. 5, to reduce dishing of interconnects, a plurality of oxide slots 210a and 212a are distributed in the lower-layer metal wiring 210 and the upper-layer metal wiring 212 respectively outside the via region 250. Within the via region 250, a plurality of m×n via plug arrays or "via farms" 350 are formed in the inter-layer dielectric 300 and a plurality of oxide slots 212b are provided in the upper-layer metal wiring 212 between two of the m×n via plug arrays 350. Each of the m×n via plug arrays 350 consists of m×n damascened metal plugs 200 and is patterned and defined according to a predetermined design rule considering lithography-limits. Preferably, m ranges from 2 to 8, and n ranges from 2 to 8, more preferably, m=n=4. According to a preferred embodiment of this invention, the oxide slot 212b has a dimension of about 0.4 $\mu$m×0.4 $\mu$m. One of the m×n via plug array blocks 350 is spaced apart from another with a predetermined distance that is greater than or equal to 1.2 microns. The via-to-slot spacing is about 0.2 microns.

When patterning the oxide slot 212b and the plurality of via farms 350, the layout pattern of the oxide slot 212b on a photo mask should not overlap with the layout pattern of the via farms 350 on another photo mask. In other words, after forming this interconnect structure according to the present invention, the oxide slot 212b formed in the upper-layer metal wiring 212 does not overlap with the via farms 350 formed in the inter-layer dielectric 300 from a top view.

In FIG. 5, a plurality of oxide slots 210b are distributed in the lower-layer metal wiring 210 within the via region 250 between two of the via farms 350. Likewise, when patterning the oxide slot 210b, the layout pattern of the oxide slot 210b on a photo mask should not overlap with the layout pattern of the via farms 350 on another photo mask. In other words, after forming this interconnect structure according to the present invention, the oxide slot 210b formed in the lower-layer metal wiring 210 does not overlap with the via farms 350 formed in the inter-layer dielectric 300 from a top view. Since the oxide slot 210b and the oxide slots 212b are formed in separate steps, they likely overlap with each other from a top view, but possibly not.

Figure 6:
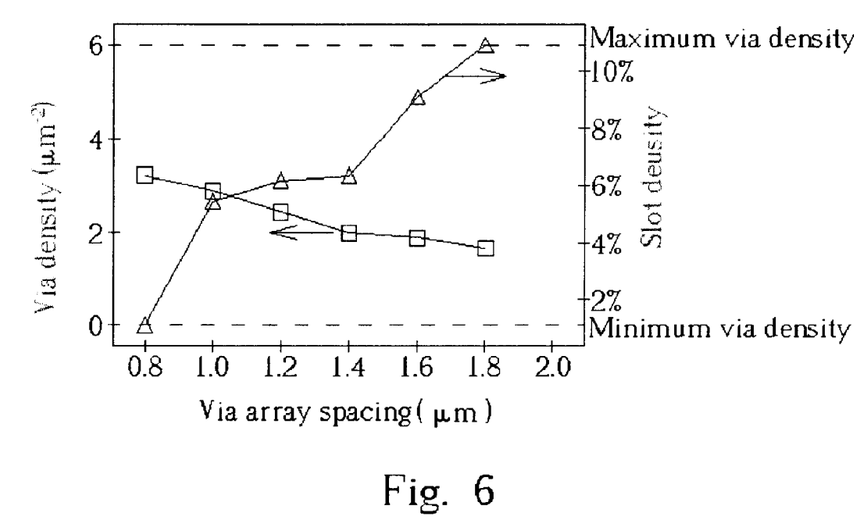
FIG. 6 is a plot presenting the relationship of 4×4 via array spacing vs. via density and 4×4 via array spacing vs. slot density respectively.

Please refer to FIG. 6. FIG. 6 plots the relationship of 4×4 via array spacing vs. via density and 4×4 via array spacing vs. slot density respectively. As shown in this plot, a minimum via density or a minimum number of the via plugs 200 that is required to carry a predetermined high density current can be calculated according to a well-known electro-migration rule (EM rule) within the via region 250. As indicated by the two dashed lines that present minimum via density and maximum via density, the quantity of via plugs 200 is chosen between the two limits. Preferably, the quantity of via plugs 200 is the minimum via density times a safety factor, for example 1.2~1.5, in order to assure steady operations during the pass of the high density current. In a case that adapts a 4×4 via farm array architecture, a via array spacing of about 1.2 microns is recommended and the via density will be about 2~3 $\mu$m$^{-2}$, and the slot density will be 4%~6%.

Figure 7:
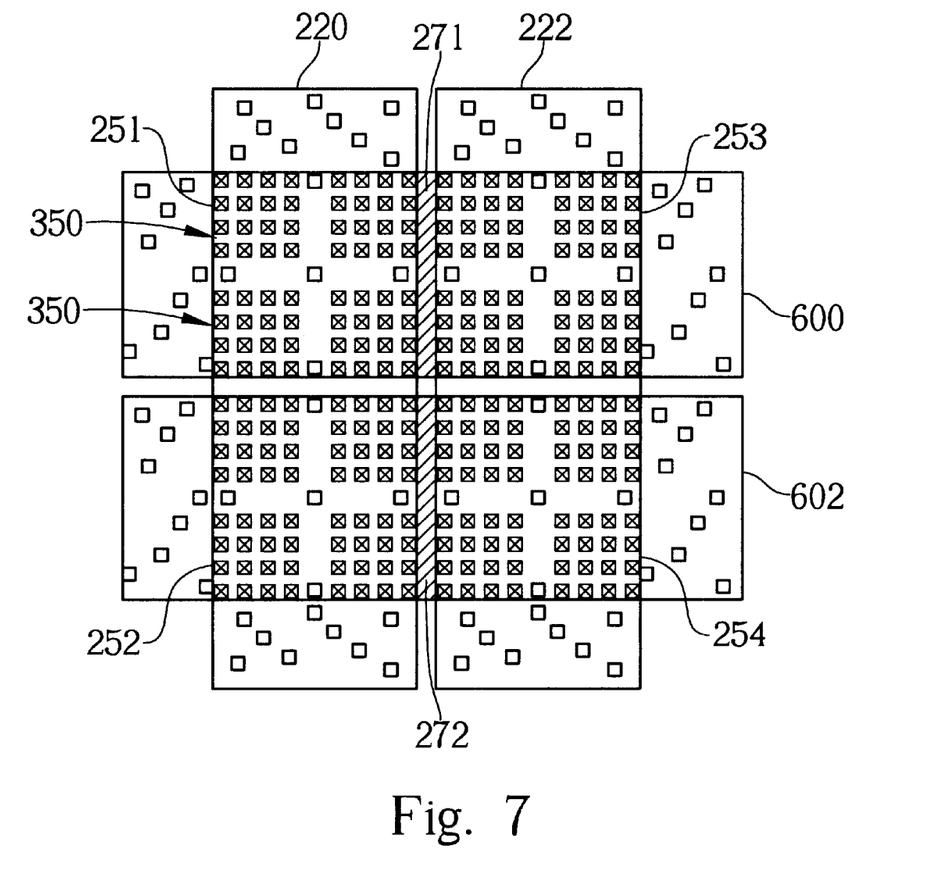
FIG. 7 is a schematic diagram partially illustrating an enlarged top view of a Cu-based dense line structure according to the present invention.

Please refer to FIG. 7. FIG. 7 is a schematic diagram partially illustrating an enlarged top view of a Cu-based dense line structure according to the present invention. As shown in FIG. 7, two upper-layer copper lines 220 and 222 and two lower-layer copper lines 600 and 602 are provided. The upper-layer copper line 220 and the lower-layer copper line 600 define a via region 251. The upper-layer copper line 220 and the lower-layer copper line 602 define a via region 252. The upper-layer copper line 222 and the lower-layer copper line 600 define a via region 253. The upper-layer copper line 222 and the lower-layer copper line 602 define a via region 254. The upper-layer copper line 220 is spaced apart from the upper-layer copper line 222 with a distance of about 0.26 microns, for example. Since oxide slots 212b are introduced into the via regions 251, 252, 253, and 254, post-CMP metal residues are not observed in the regions 271 and 272 between the two adjacent copper lines 220 and 222 after performing a CMP.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A metal interconnect structure, comprising:
   a lower-layer metal wiring;
   an upper-layer metal wiring partially overlapping with the lower-layer metal wiring to define a via region thereof;
   a dielectric layer disposed between the lower-layer metal wiring and the upper-layer metal wiring;
   a plurality of m×n array via plug blocks arranged in the dielectric layer within the via region for electrically connecting the lower-layer metal wiring and the upper-layer metal wiring; and
   a plurality of first dielectric structures embedded in the upper-layer metal wiring within the via region.

2. The metal interconnect structure of claim 1 further comprising a plurality of second dielectric structures embedded in the lower-layer metal wiring within the second area of the via region.

3. The metal interconnect structure of claim 1 wherein the first dielectric structures are used to reduce dishing effects when the upper-layer metal wiring is subject to a chemical-mechanical polishing (CMP) process within the via region.

4. The metal interconnect structure of claim 1 wherein the upper-layer metal wiring is composed of copper.

5. The metal interconnect structure of claim 1 wherein the lower-layer metal wiring is composed of copper.

6. The metal interconnect structure of claim 1 wherein the via plug blocks comprise at least a first via plug block and a second via plug block.

7. The metal interconnect structure of claim 1 wherein m=n.

8. The metal interconnect structure of claim 6 wherein the first via plug block is spaced apart from the second via plug block with a predetermined distance.

9. The metal interconnect structure of claim 8 wherein the predetermined distance is about 1.2 microns.

10. A structure of a copper interconnect capable of reducing CMP dishing effects, comprising:
    an upper copper damascened wiring;
    a lower copper damascened wiring overlapping with the upper copper damascened wiring to define a via region thereof;
    a dielectric layer disposed between the upper copper damascened wiring and the lower copper damascened wiring;
    a plurality of m×n via plug array blocks arranged in the dielectric layer within the via region for electrically connecting the lower copper damascened wiring and the upper copper damascened wiring;
    a plurality of first dielectric structures embedded in the upper copper damascened wiring within the via region between two of the m×n via plug array blocks; and
    a plurality of second dielectric structures embedded in the lower copper damascened wiring within the via region between two of the m×n via plug array blocks.

11. The structure of claim 10 wherein the first dielectric structures are used to reduce dishing effects when the upper copper damascened wiring is subject to a chemical-mechanical polishing (CMP) process within the via region.

12. The structure of claim 10 wherein m=n.

13. The structure of claim 10 wherein m ranges from 2 to 8.

14. The structure of claim 10 wherein n ranges from 2 to 8.

15. The structure of claim 10 wherein one of the m×n via plug array blocks is spaced apart from another with a predetermined distance.

16. The structure of claim 15 wherein the predetermined distance is about 1.2 microns.

17. The structure of claim 10 further comprising a copper wiring laid on one side of the upper copper damascened wiring, wherein the upper copper damascened wiring is spaced apart from the copper wiring with a distance that is greater than a minimum distance.

18. The structure of claim 17 wherein the minimum distance is about 0.26 microns.

* * * * *